United States Patent [19]

Benicourt et al.

[11] Patent Number: 4,499,329
[45] Date of Patent: Feb. 12, 1985

[54] THERMOELECTRIC INSTALLATION

[75] Inventors: Michel Benicourt, Versailles; Jean Buffet, Paris; Jean-François Huard, Pont-a-Mousson, all of France

[73] Assignee: Air Industrie, Courbevoie, France

[21] Appl. No.: 515,972

[22] Filed: Jul. 21, 1983

[30] Foreign Application Priority Data

Mar. 17, 1983 [FR] France .............................. 83 04541

[51] Int. Cl.³ ............................................ H01L 35/28
[52] U.S. Cl. ......................................... 136/208; 62/3; 136/212
[58] Field of Search ...................... 136/208, 212; 62/3

[56] References Cited

U.S. PATENT DOCUMENTS 4,125,122 11/1978 Stachurski ........................ 136/212
4,306,426 12/1981 Berthet et al. ............................ 62/3
4,420,940 12/1983 Buffet ........................................ 62/3

Primary Examiner—Leland A. Sebastian
Attorney, Agent, or Firm—Larson and Taylor

[57] ABSTRACT

Thermoelectric installation of the "heat pump" type, in which the thermoelements 1 and the exchangers 2 and 3 are stacked to form columns, these assembled to form a rack.

The rows of exchangers 2 and 3 demarcate two conduits for the circulation of a hot fluid and a cold fluid. These conduits are situated outside the stacking axes of the columns, so that adjacent exchangers can turn in relation to each other. The thermoelements and the exchangers are in contact by at least one cylindrical or spherical profile surface.

This assembly allows proper tightening of the columns and therefore good contact between exchanger and thermoelement without destruction of the thermoelements.

10 Claims, 6 Drawing Figures

THERMOELECTRIC INSTALLATION

The invention generally relates to thermoelectric installations comprising thermoelements (or thermoelectric elements) mounted between heat exchange walls pertaining to heat exchangers through which flows a hot fluid and to cold exchangers through which flows a cold fluid.

This type of installation can be used to generate a continuous electric current when the heat exchange walls are kept at different temperatures by the hot fluid and the cold fluid or, conversely, to keep the heat exchange walls at different temperatures with the object of heating or cooling a fluid with respect to the other when an electric current is passed through the thermoelements. The electric current is generally fed to the thermoelements by the exchangers. However, if thermoelectric modules are used, the electric current is fed directly to the modules.

The invention is more particularly, but not exclusively, related to the latter types of installation, the thermoelements being fed by a continuous electric current in order to maintain a temperature difference between the heat exchange walls. Such an installation, called "heat pump", can be used for purposes of air conditioning by heating or cooling a fluid by means of another fluid. As a matter of fact, thermoelements are of two types, to wit: P-type thermoelements, which transfer calories in the direction of the electric current, and N-type thermoelements, which transfer calories in the opposite direction of the current. Thus, by placing an N-type thermoelement and a P-type thermoelement on both sides of a heat exchanger, the heat flow rates of the same nature (heat or cold) created by these thermoelements converge toward the heat exchanger or diverge according to the direction of the current.

Proposals have been advanced in the past to form thermoelectric installations by stacks of heat and cold exchangers that alternate with thermoelements, the thermoelements arranged on both sides of the exchanger or exchangers being electrically insulated or not, said stacks or columns being placed side by side in such a way as to form a compact assembly in which the thermoelements are disposed in parallel planes or rows and the exchangers facing each other forming rows of heat or cold exchangers so as to form hot-fluid or cold-fluid circulation ducts. The constituent elements of each column are connected together only by compression of the thermoelements and exchangers of the same column by means of devices that ensure the tightening of several columns at a time and intended to ensure satisfactory electrical connections between these different elements while assisting in their assembly. Moreover, the electrical connections between the columns are produced at their ends.

In prior art installations, the thermoelements and the exchangers of the same column are stacked along a common axis and are tightened therealong. However, because of the expansions due to the thermal flows, because of the disparities between the thicknesses due to the accuracy of of finish of the various stacked constituent elements, and in order to obtain an alignment of the exchangers of the same plane of several columns, as well as proper contact between the thermoelements and the exchangers during the tightening, it is necessary to create considerable tightening stresses which are not acceptable by the thermoelements whose mechanical properties, particularly their resistance to shearing, are relatively weak.

To reduce the stresses on the thermoelements produced during the tightening in order to obtain proper contact between thermoelements and exchangers, as well as proper alignment between the exchangers of the same row, it is common practice to use various means. In particular, deformation exchangers can be used, but these exchangers are difficult to construct and are therefore costly, and they have weak thermal and electrical conduction properties due to the fact that certain parts of these exchangers must be thinned down to enable them to deform during the tightening of the columns.

In certain installations of known construction, it may happen that, without increasing the strains on the thermoelements, the exchangers of the same row are not perfectly aligned so that the linking between exchangers must be flexible in this case. This flexible linking can be produced by flexible connections. However, these connections are costly, difficult to mount, and are sources of leaks for the fluid conveyed.

Another means for producing a flexible connection between the exchangers is to circulate the fluid to be cooled or heated in one or more tubes or ducts which pass through the exchangers of the same row. However, for the connection between these exchangers to be flexible, these tubes must themselves be flexible. In this case, the contact pressure between this tube and the exchangers, which pressure is produced by the transported fluid, must be high in order to obtain the weakest possible thermal contact resistance between the exchangers and the tube, which renders complex the junctions between tubes of the same row and/or various rows.

The object of the present invention is to eliminate the disadvantages outlined above by permitting a rigid connection between the exchangers of the same row. It aims at providing a thermoelectric installation comprising thermoelements that are mounted between heat exchangers provided with a hot-fluid or a cold-fluid duct and alternating with the thermoelements to form stacks or columns placed side by side in such fashion as to form an assembly or mounting rack in which the thermoelements are disposed in parallel planes and the exchangers facing each other in the form of rows, defining two fluid circulation ducts, one for the hot fluid and the other for the cold fluid, the constituent elements of each column being held together by tightening means.

This installation is particularly remarkable in that that, since the hot-fluid or cold-fluid circulation ducts of the exchangers are situated outside the tightening axis of the stacks, the exchangers adjacent to the same row can turn relative to one another about the axis of their circulation duct, the thermoelements and the exchangers being in contact along the tightening axis of the stacks, their contacts on at least one of their surfaces having a profile which permits a rotation in relation to the axis of the circulation ducts.

Thus, during the tightening of the constituent elements of several columns placed side by side, the exchangers will rotate about the axis of the duct which they form until the constituent elements of each column are in a proper bearing relation with each other, the ducts formed by all the exchangers of the same row thus creating a single continuous circulation duct for the fluids.

The profile of the contacts between exchangers and thermoelements can be a cylindrical profile with an axis parallel to the axis of the circulation ducts and passing through the tightening axis of the stack.

Likewise, the profile of contacts between exchangers and thermoelements can be a spherical profile whose center is located on the tightening axis of the stacks.

Because of the cylindrical or spherical contacts between each exchanger and thermoelement, this rotation is produced without creating shearing stresses in the thermoelements.

An installation based on this invention may comprise heat exchangers, each of which is formed by a block located, in contact, between the thermoelements and traversed by a duct which is offset in relation to the tightening axis of the stacks and having the same axis as the duct of an exchanger of the neighboring column, ducts in which is crimped a rigid tube which is electrically insulating or is electrically insulated from the exchangers, said exchangers being capable of rotating about the tube.

Therefore, any displacement of the exchanger under the effect of the tightening stress is converted into a rotation about a rigid tube, the spherical contact between exchangers and thermoelements permitting said rotation without creating a shearing force which could destry the thermoelements.

Other features and advantages will become apparent from the description below with reference to the accompanying drawings, wherein.

Figure 1:
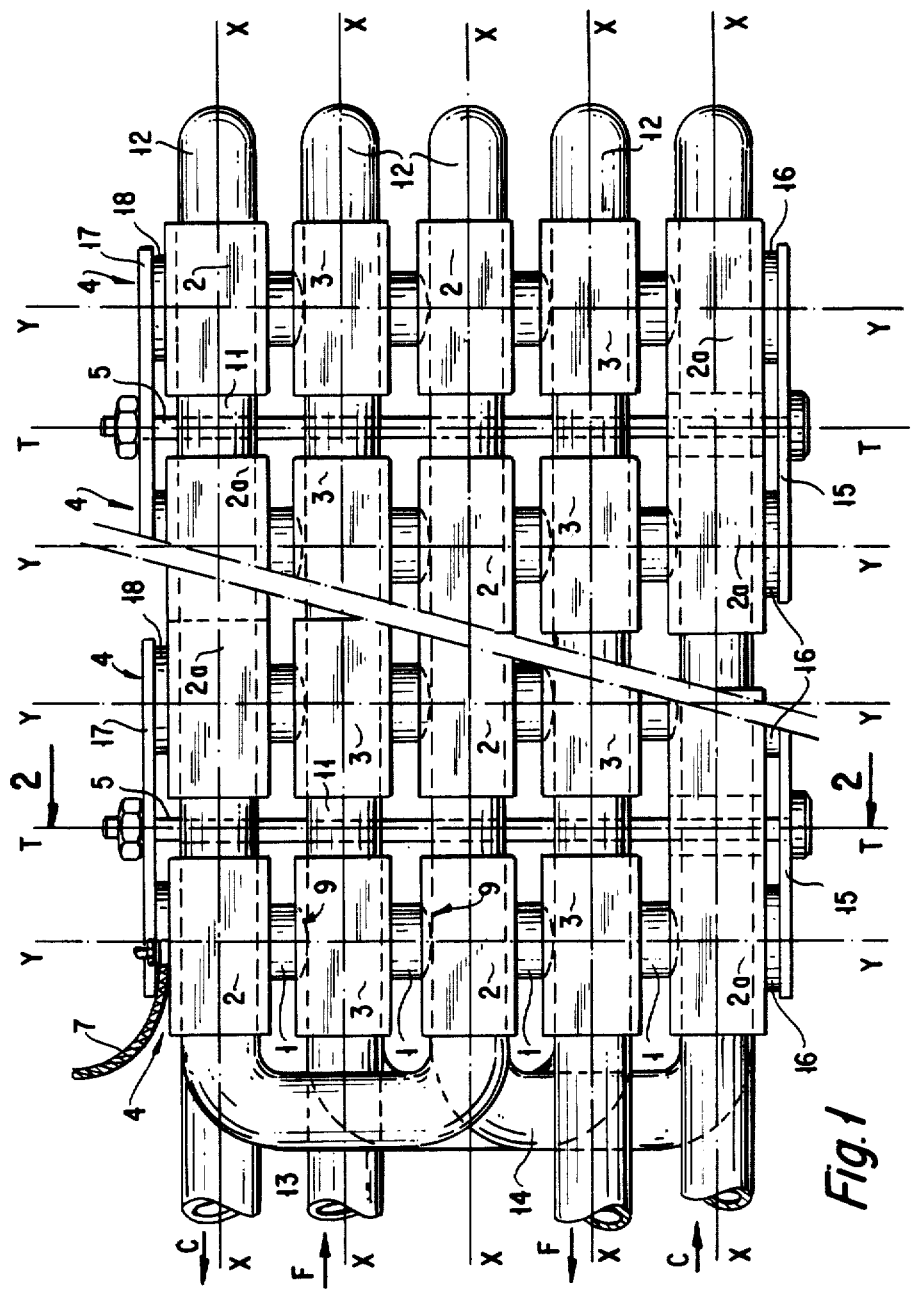
FIG. 1 is a schematic elevational view of a thermoelectric installation embodying the invention.
Figure 2:
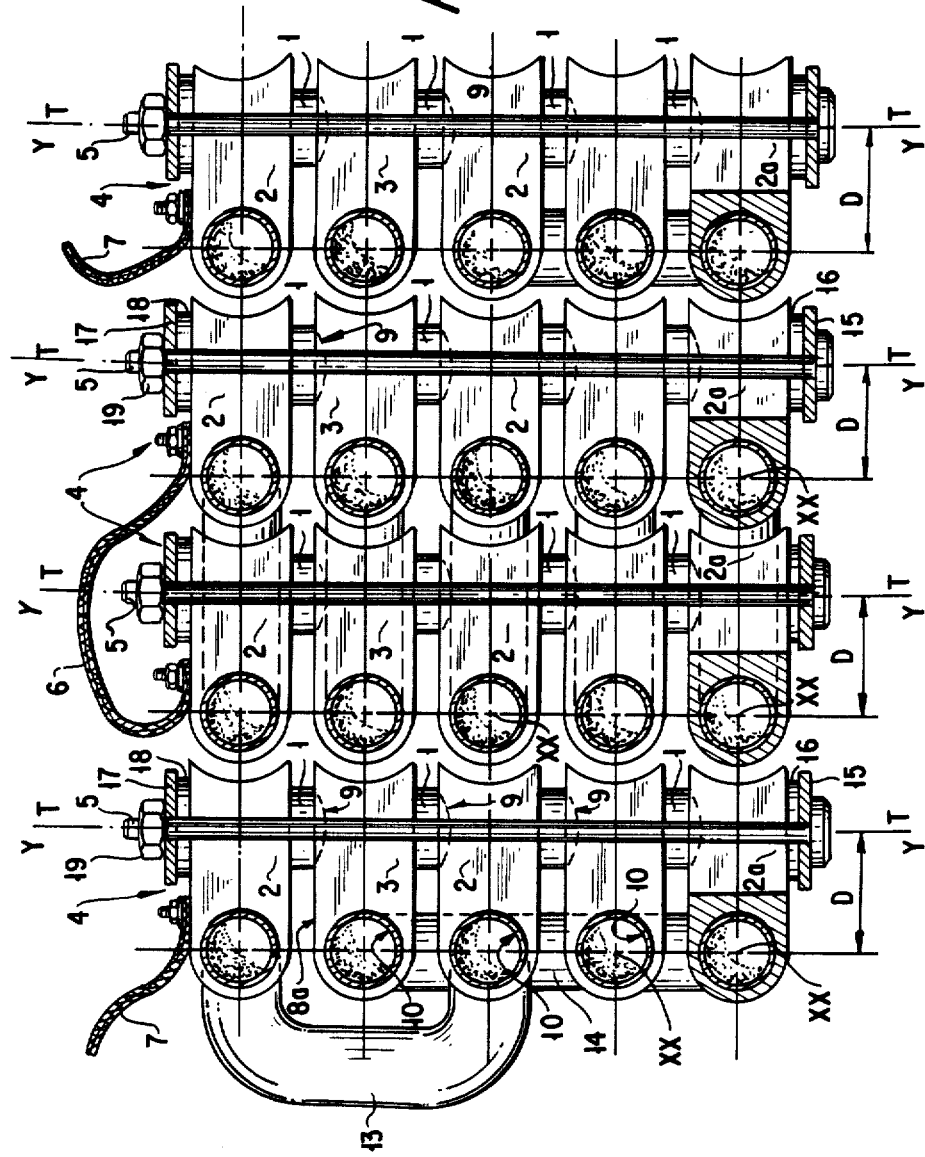
FIG. 2 is a schematic cross-sectional view taken along the line 2—2 of FIG. 1 of a thermoelectric installation based on the invention.
Figure 3:
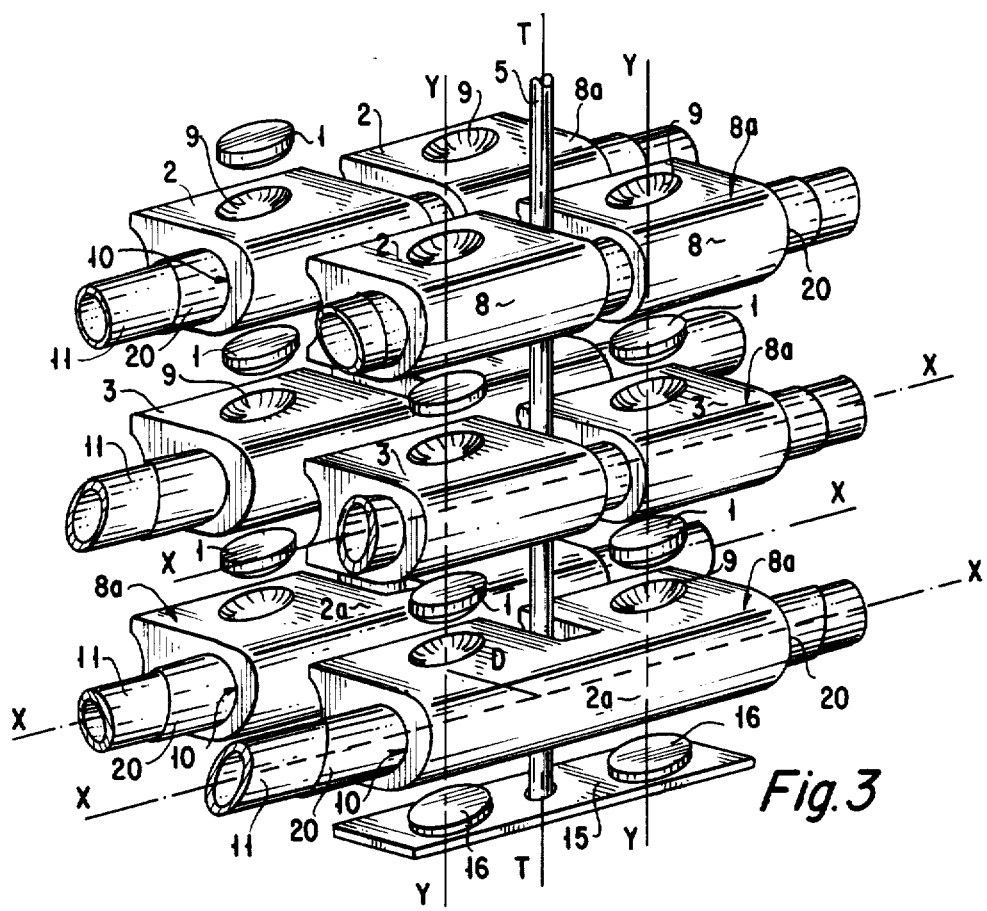
FIG. 3 is a schematic partially exploded perspective view on a larger scale than FIGS. 1 and 2 of an thermoelectric installation according to the invention.

According to the practical embodiment shown in FIGS. 1 to 3, a thermoelectric installation of the "heat pump" type taught by the present invention comprises thermoelements or thermoelectric elements 1 supplied by a continuous electric current in order to maintain a temperature difference between the heat exchangers 2 and 3 located on both sides of each thermoelement 1.

These thermal exchangers 2 and 3 are heat exchangers when a hot fluid or a fluid to be heated flows therethrough, and cold exchangers when a cold fluid or a fluid to be cooled flows therethrough. The directions of flow of these hot and cold fluids are denoted by the arrows C and F, respectively, in FIG. 1.

The heat exchangers 2 and 3 are stacked alternately with the thermoelements 1 to form columns 4. These columns placed side by side and mounted together form a thermoelectric assembly or mounting rack where the thermoelements are disposed in parallel planes and the exchangers facing each other in the form of rows. The exchangers and thermoelements are mounted together by means of tie rods 5 having an axis TT parallel to columns 4, each tie rod 5 assuring the tightening of two neighboring columns in the non-limitative example shown.

Since the thermoelements 1 are not insulated electrically from the exchangers 2 and 3, in each column the electrical connection of the thermoelements of the same column is produced by means of the exchangers in accordance with a rectilinear path; the passage of the electric current between two neighboring columns occurs either by means of double exchangers 2a obtained by coupling two neighboring exchangers, or by conductors 6 (flexible or not) affixed to the two terminal exchangers 2 of the neighboring columns. The electric current is fed to the whole of the installation through the input and output conductors 7 affixed to two exchangers 2.

According to the teachings of the invention, each thermoelement 1 takes the form of a cylindrical pellet provided with a flat surface and a surface with a spherical profile. Each exchanger 2 and 3 is formed by a substantially parallelepipedal block 8, one of the surfaces 8a of which is provided with a dish 9 having a spherical profile paired with the surface having a spherical profile of a thermoelement 1 with which it must come into contact. Each exchanger is traversed by a duct 10 having a circular cross section of the axis XX parallel to the surface 8a of the block 8 and offset at a distance D from the normal YY to said surface 8a in the center of the dish 9.

Within the ducts 10 of the same row and, thus, with the same axis XX, there is expanded a rigid tube 11 which, preferably, is a good heat conductor. This expansion is effected such that under the effect of a certain stress the block 8 can turn about the tube 11. If the rigid tube 11 is made from a electrically conducting material, such as copper or another metal, there is inserted, prior to expansion, between the tube 11 and the duct 10 an electrically insulating material such as a polyester film 20, which film facilitates the rotation of the block 8 about the tube 11. The tubes 11 of the same row of exchangers 2 or 3 are connected together at the ends by the ends 12 so as to form a continuous circuit of a stream of fluid. In the example shown (with 4 rows of thermoelements 1 and, consequently, with 5 rows of exchangers 2 and 3), the tubes 11 of the rows of exchangers 2 are connected to each other by the bends 13 to form a single circulation circuit of one of the fluids, such as the hot fluid, circulating in the direction of the arrows C. Likewise, the tubes 11 of the rows of exchangers 3 are connected to each other by the bends 14 to form a single circuit for the circulation of the other fluid, such as the cold fluid, circulating in the direction F. Due to the presence of the bends 14 and 13, the tubes 11 are rigidly connected to each other.

The thermoelectric installation is mounted as follows:

Since each row of exchangers is formed with the tubes 11 and the connecting bends 12 of the tubes of the same row, these rows are stacked upon one another by inserting in the dishes 9 of the exchangers the thermoelements on which is applied the row of exchangers immediately thereabove. After stacking all of the rows of exchangers and thermoelements (4 thermoelements and 5 exchangers per column in the example shown), each tie rod 5 affixed to a support plate 15 and to electrically insulating cylindrical contacts 16, is introduced by traversing the rows of exchangers between two neighboring exchangers of the same row and carried by the same tube, the support plate 15 being applied by the cylindrical contacts 16 beneath the exchangers of the lower row along the stacking axis YY of the columns to be tightened. A tightening plate 17 traversed by the tie rod 15 is applied by the cylindrical electrically insulating cylindrical contact 18 on the exchangers of the corresponding columns of the upper row, a nut 19 screwed onto the tie rod 5 ensuring the tightening of the various rows between each other. Following the tightening, the bends 13 and 14 are coupled to the tubes, for example, by welding, in order to ensure the continuity of circulation of the hot and cold fluids.

Under the action of the tightening of the tie rod 5 along the axis TT parallel to the axes YY of the columns, the blocks 8 of the exchangers and the corresponding thermoelements 1 of the same column are tightened together. Owing to the dimensional differences which may occur during the manufacture of the various elements, the columns may have different heights and the blocks of the exchangers of the same row may not be perfectly arranged in the same plane. Since the tubes 11 and the bends 12 connecting the exchangers of the same row are rigid, and since the tightening of the columns by the tie rods is realized along the axes YY, offset by a distance D from the corresponding axes XX of the tubes 11, a rotation is produced about the axes XX of the block 8 of the exchangers in relation to the tubes 11, which permits one to obtain a proper tightening of the columns despite these dimensional differences, said tightening occurring without causing the tubes to be deformed between the exchangers or the thermoelements located therebetween to be destroyed. The dishes 9 of the blocks 8 of the exchangers and the spherical support surfaces of the thermoelements in the dishes 9 enable the blocks 8 to rotate, thereby ensuring a proper contact of the thermoelements on the exchangers without destroying the thermoelements by the shearing produced during the rotation of the blocks 8.

Therefore, thanks to the invention, it is possible to design a thermoelectric installation consisting of hot and cold-fluid circulation tubes without the danger of leaks between exchangers, since they consist of rigid and continuous tubes 11 and there is proper electrical and thermal conduction between exchangers and thermoelements. This proper electrical and thermal conduction is obtained because of the considerable tightening that can be realized between the thermoelements and the exchangers by means of the tie rods, despite the dimensional differences produced during their stacking. These features are achieved by utilizing the rotation of the exchangers in relation to the tubes 11 and the spherical contacts between exchangers and thermoelements.

Since the exchangers and the thermoelements are solely in contact by at least one surface with a spherical profile without rigid connection between each other, this contact permits the differential thermal expansions between the exchangers of the same row.

The presence of an electrically insulating film 20 between the tubes 11 and the ducts 10 of the webs 8 of the exchangers 2 and 3, while ensuring the electrical insulation without significantly increasing the heat resistance between the exchangers 2 and 3 and the tubes 11, facilitates—if this film is smooth—the rotation of the blocks 8 in relation to the tubes 11 and, thereby, the tightening of the columns by the tie bolts 5.

Figure 4:
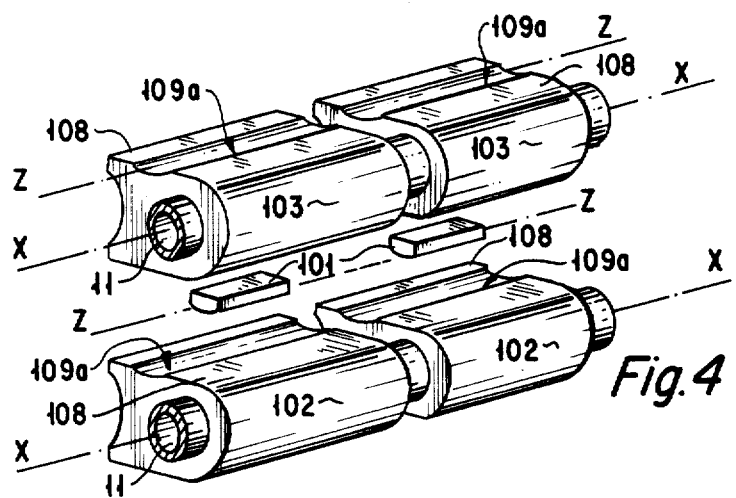
FIG. 4 is a partial schematic view of the same type as in FIG. 3 of a variant form of the thermoelectric installation according to the invention.

According to an embodiment shown in FIG. 4, the exchangers 102–103 and the thermoelements 101 can be in contact by at least one surface with a cylindrical profile having an axis ZZ parallel to the axis XX of the circulation ducts of the exchangers, the axis ZZ of the surface passing through the tightening axis YY of the thermoelements. In this case, the dishes 109a of the blocks 108 and the corresponding support surfaces of the thermoelements have a cylindrical profile. Like the spherical profile, this cylindrical profile facilitates the rotation of the exchangers between each other and the differential thermal expansions.

Figure 5:
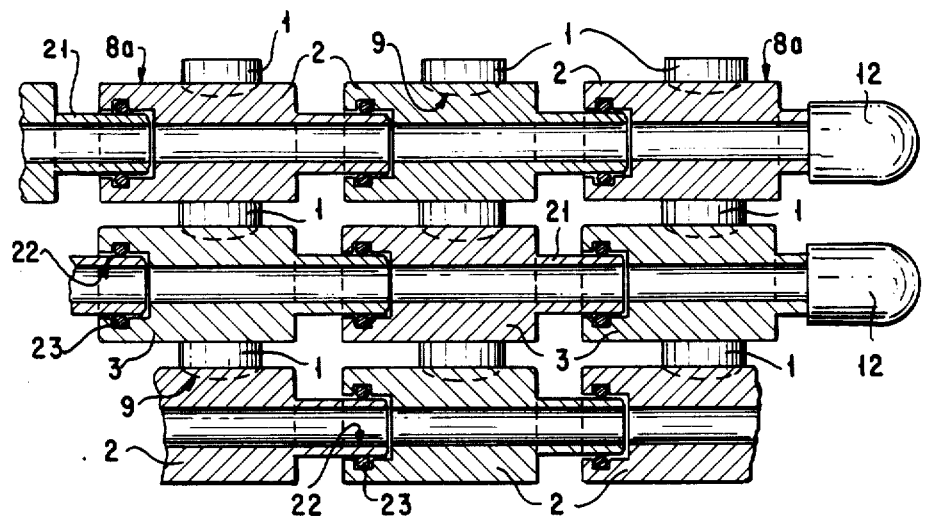
FIG. 5 is a schematic partial cross-sectional view of another variant form of a thermoelectric installation according to the invention.

According to an embodiment shown in FIG. 5, the thermoelectric installation consists of columns formed by the stacking of thermoelements 1 and exchangers 2 and 3 formed by a block 8 provided with a duct 10. This duct 10 has, on one side, a tubular extensions 21 and, on the other side, a circular chamber 10 inside the duct 10 forming a nesting for the tubular extension of the neighboring exchanger, said chamber being provided with an annular, circumferential groove 23 which encloses a seal. The exchangers of the same row are then nested into each other to form a fluid-circulation tube. The linking by nesting with seal 24 enables the exchangers, during the tightening of the tie rods, to carry out a rotation relative to each other about the axis XX of the duct 10, while preserving the continuity of the fluid-circulation tubes.

To ensure the electrical insulation between exchangers of different columns, the tubular extensions 21 can be covered on their external surface and their terminal end with an insulating lining such as an insulating paint or by a linking made from insulating material, e.g., polyester. In this embodiment, it is desirable that the fluids be poor electrical conductors or that the ducts 10 have an internal insulating coating.

Even though in the embodiments described above, the thermoelements take the shape of a cylindrical or paralellepipedal pellet having a flat surface or a spherical or cylindrical surface, they can have two spherical or cylindrical surfaces, or they may be formed by two flat surfaces on which two plates are mounted through welding, at least one of which has a spherical or cylindrical surface intended to be placed in the dishes 9 of the exchangers 2 and 3 with a corresponding shape.

Moreover, it is possible that the thermoelements have the spherical or cylindrical dishes and that the exchangers have bosses with a profile that corresponds to that of the thermoelements.

It is also possible to replace each thermoelement by a thermoelectric module composed of several thermoelements, on which is mounted at least one plate having a surface with a cylindrical or spherical profile. The electric supply of the thermoelectric modules occurs in the known manner, each thermoelectric module being electrically insulated from the exchangers. In this case, it is no longer necessary to ensure the electrical insulation between the neighboring exchangers, especially between the exchangers and the circulation tubes.

The use of thermoelectric modules in the embodiment of FIG. 5 enables one to dispense with the insulating lining of the tubular extensions 21. The fluids may be electrical conductors, since the exchangers are no longer energized.

Figure 6:
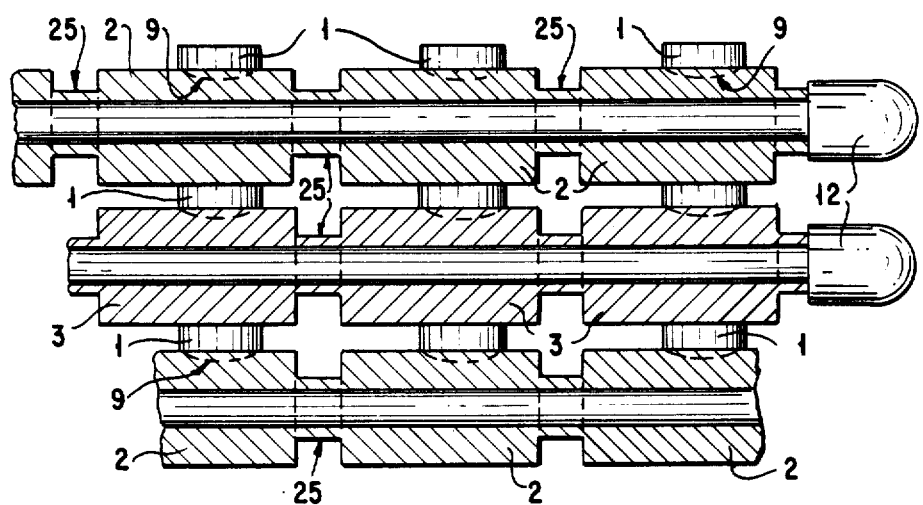
FIG. 6 is a schematic partial cross-sectional view of another embodiment of the thermoelectric installation according to the invention.

Using thermoelectric modules, in another embodiment shown in FIG. 6, the exchangers of the same row forming a single duct are made of a single piece, thinned-down areas 25 being produced between each exchanger so that said thinned-down areas permit the rotation of the exchangers relative to each other by deformation of the ductile material of which they are composed in said thinned-down areas.

I claim:

1. A thermoelectric installation comprising thermoelements mounted between heat exchangers (2-3, 102-103) provided with a hot-fluid (C) or cold-fluid (F) circulation duct (10) and alternating with the thermoelements to form stacks or columns (4) placed side by side so as to form an assembly or mounting rack in which the thermoelements are placed in parallel planes and the exchangers facing each other in the form of rows, demarcating two fluid circulation ducts, one for the hot fluid and the other for the cold fluid, the constituent elements of each column being held together by tightening means (5), characterized in that, since the hot or cold-fluid circulation ducts (10) of the exchangers are located outside the tightening axis (YY) of the stacks, the exchangers (2-3, 102-103) adjacent to one row can turn in relation to one another about the axis (XX) of their circulation duct (10), the thermoelements and the exchangers being in contact along the tightening axis (YY) of the stacks, their contacts on at least one of their surfaces having a profile that permits a rotation in relation to the axis of the circulation ducts.

2. The thermoelectric installation according to claim 1, characterized in that the profile of contact between exchangers (102-103) and thermoelements (101) is a cylindrical profile having an axis which is parallel to the axis of the circulation ducts and passing through the tightening axis of the stack.

3. The thermoelectric installation according to claim 1, characterized in that the profile of contact between exchangers (2-3) and thermoelements (1) is a spherical profile whose center is located on the tightening axis (YY) of the stack.

4. The thermoelectric installation according to claim 1, characterized in that it comprises heat exchangers (2-30, 102-103) formed by a block (8, 108) placed in contact between the thermoelements (1, 101) and traversed by a duct (10) which is offset in relation to the tightening axis (YY) of the stacks and having the same axis (XX) as the duct of an exchanger of the neighboring column, there being expanded in said ducts a rigid tube (11) which is electrically insulating or is insulated electrically from the exchangers which, in relation to the tube, can turn about the axis (XX) of the ducts (10).

5. The thermoelectric installation according to claim 4, characterized in that an electrically insulating film (20) is inserted between the rigid electrically conducting tube and the ducts (10) of the exchangers.

6. The thermoelectric installation according to claim 1 to, characterized in that it comprises heat exchangers (2-3, 102-103) formed by a block (8, 108) placed in contact between the thermoelements (1, 101) and traversed by a duct (10) which is offset in relation to the tightening axis (YY) of the stacks and has the same axis (XX) as the duct (10) of an exchanger of the same row, the exchangers being fitted into one another by their ducts.

7. The thermoelectric installation according to claim 6, characterized in that the duct (10) of each exchanger carries, on one side, a tubular extension (21) of the duct and, on the other, a circular chamber (22) within the duct for encasing the tubular extension (21) of the neighboring exchanger.

8. The thermoelectric installation according to claim 1, characterized in that the thermoelements (1, 10) have the form of pellets with flat surfaces on which are built up plates, at least one of which has a surface with a profile that permits a rotation in relation to the axis of the circulation ducts.

9. The thermoelectric installation according to claim 1, characterized in that the thermoelements are thermoelectric modules on which are mounted plates, at least one of which has a surface with a profile which permits a rotation in relation to the axis of the circulation ducts.

10. The thermoelectric installation according to claim 9, characterized in that the exchangers of the same row are made of one piece, thinned-down areas between exchangers permitting the latter to rotate together about the axis of the circulation ducts.

* * * * *